United States Patent [19]
Dekker et al.

[11] Patent Number: 5,689,138
[45] Date of Patent: Nov. 18, 1997

[54] INTEGRATED MICROWAVE SEMICONDUCTOR DEVICE WITH ACTIVE AND PASSIVE COMPONENTS

[75] Inventors: Ronald Dekker; Henricus G. R. Maas; Wilhelmus T. A. J. Van Den Einden, all of Eindhoven, Netherlands

[73] Assignee: U.S. Philips Corporation, New York, N.Y.

[21] Appl. No.: 548,932

[22] Filed: Oct. 26, 1995

[30] Foreign Application Priority Data

Oct. 31, 1994 [EP] European Pat. Off. ............ 94203161

[51] Int. Cl.$^6$ ..................................... H01L 23/34
[52] U.S. Cl. ............... 257/728; 257/275; 257/276; 257/277; 257/707; 333/247
[58] Field of Search .................... 257/275, 276, 257/277, 528, 539, 625, 663, 706, 707, 728; 333/247, 250

[56] References Cited

U.S. PATENT DOCUMENTS

| | | | |
|---|---|---|---|
| 4,418,470 | 12/1983 | Naster et al. | 29/577 |
| 4,956,697 | 9/1990 | Kobiki et al. | 257/728 |
| 5,063,177 | 11/1991 | Geller et al. | 257/728 |
| 5,449,953 | 9/1995 | Nathanson et al. | 257/624 |

Primary Examiner—Minh-Loan Tran
Attorney, Agent, or Firm—Michael E. Marion

[57] ABSTRACT

A semiconductor device for microwave frequencies with a substrate which is provided at a first side with a semiconductor element, a passive element, and a pattern of conductive elements, while the opposed, second side is provided with a metallization which is connected to the elements present on the first side through windows formed in the substrate. The substrate consists of a silicon layer which is present on a layer of insulating material, the semiconductor element being formed in the silicon layer, and the metallization being provided on that side of the layer of insulating material which is remote from the silicon layer. The silicon layer may here have a very small thickness of, for example, 0.1 to 0.2 μm. In such a thin silicon layer, bipolar and field effect transistors capable of processing signals of microwave frequencies can be formed. Since the silicon layer is thin, the influence of the conductivity of silicon on passive elements is small.

20 Claims, 3 Drawing Sheets

INTEGRATED MICROWAVE SEMICONDUCTOR DEVICE WITH ACTIVE AND PASSIVE COMPONENTS

BACKGROUND OF THE INVENTION

1. Field of the Invention

The invention relates to a semiconductor device for microwave frequencies with a substrate which is provided at a first side with a semiconductor element, a passive element, and a pattern of conductive elements, while the opposed, second side is provided with a metallization which is connected to the elements present at the first side through windows formed in the substrate.

2. Background of the Related Art

A semiconductor device, which is suitable for processing very high-frequency microwave signals, is called a "Microwave Monolithic Integrated Circuit" (MMIC). The semiconductor element may be, for example, a bipolar or field effect transistor, the passive element, for example, a capacitor, a coil, or a transmission line. To distinguish it from the passive element, the semiconductor element is referred to as the active element. In practice, the semiconductor device may comprise a few, but also very many of these active and passive elements.

U.S. Pat. No. 4,956,697 discloses a semiconductor device of the kind mentioned in the opening paragraph wherein the substrate is formed by a slice of gallium arsenide (GaAs).

Gallium arsenide is highly suitable for use as a material for the semiconductor substrate in the manufacture of semiconductor devices used for processing signals with microwave frequencies. This is not only because transistors can be made in this material which can process signals with such high frequencies, but also because this material is practically an insulator. This renders it possible to provide passive elements operating at microwave frequencies on the semiconductor substrate and thus integrate them into the semiconductor device. Silicon is not used because this material always has a comparatively high conductivity in practice. When, for example, a coil is formed on a silicon substrate, this coil will have a very low quality factor compared with an identical coil provided on a gallium arsenide substrate. This factor is indeed so low that the use of such a coil in a circuit is of no practical use.

SUMMARY OF THE INVENTION

The invention has for its object inter alia to provide a semiconductor device for microwave frequencies with a substrate provided at a first side with a semiconductor element operating at these high frequencies and a passive element operating at these high frequencies, while the semiconductor element is formed in silicon.

According to the invention, the semiconductor device mentioned in the opening paragraph is for this purpose characterized in that the substrate is formed by a layer of silicon which is present on a layer of insulating material, the semiconductor element being formed in the silicon layer and the metallization being formed on that side of the layer of insulating material which is remote from the silicon layer. The silicon layer may here have a very small thickness of, for example, 0.1 to 0.2 μm. Bipolar as well as field effect transistors capable of processing signals of microwave frequencies can be formed in such a thin silicon layer. Since the silicon layer is so thin, the passive element can be provided on this silicon layer without the conductivity of silicon exerting the considerable adverse influence on the passive elements mentioned above.

In a preferred embodiment of the semiconductor device according to the invention, this adverse influence is indeed entirely avoided because the semiconductor element is formed in an insulated silicon island, and the passive element is formed beside said silicon island on the insulating layer.

A disadvantage of the known semiconductor device described above, where the substrate is a slice of gallium arsenide, is furthermore that heat generated during operation of the semiconductor device cannot be readily discharged. To facilitate the heat removal, the substrate of the known semiconductor device is locally thinned by etching from the second side and provided with grooves. The heat generated during operation can then be discharged through the metallization provided on the second side.

In the semiconductor device according to the invention, preferably, the substrate provided with the semiconductor element, with the passive element, and with the conductive elements is fastened with its first side to an insulating body by means of a layer of glue. This insulating body ensures that the semiconductor device has a sufficient strength. The insulating layer, accordingly, can have a small thickness, so that heat generated during operation can be readily discharged through this thin insulating layer.

The insulating layer may then have a very small thickness of, for example, 0.1 to 0.2 μm if the substrate is formed from a slice of silicon which is provided at its first side with a buried layer of silicon oxide and from which the silicon is removed from the second side down to the buried layer.

The heat generated during operation is in addition discharged through the metallization provided on the second side of the substrate. Preferably, this metallization is formed by electrochemically grown metal parts (bumps). Such metal parts may be used not only for heat removal but also for mounting the semiconductor device on a carrier of insulating material which is provided with conductor tracks. The elements on the first side of the substrate are then connected to these conductor tracks through said metal parts, so that the elements are externally contacted.

The grown metal parts connected to the conductive elements provided on the first side of the substrate then mainly serve for electrical contacting. The metal parts connected to the silicon layer provided on the first side or to the passive element provided on the first side serve for contacting or heat removal, or contacting and heat removal.

In a preferred embodiment of the semiconductor device according to the invention, the passive element is a coil formed by a metal track provided on the layer of insulating material, which track is provided with an electrochemically grown metal part over substantially its entire length through a window provided in the layer of insulating material. The coil thus consists of comparatively thick turns formed by a comparatively thin metal track on which a comparatively thick layer of metal has been grown. As a result, the coil has a comparatively low ohmic resistance, so that its quality is high. The metal parts grown on the second side and forming the coil turns are preferably not connected to the conductor tracks present on the carrier of insulating material during mounting of the semiconductor body thereon. Only that portion of the grown parts is connected thereto which serves for external contacting of the semiconductor device.

BRIEF DESCRIPTION OF THE DRAWINGS

The invention will be explained below in more detail, by way of example, with reference to a drawing in which.

DETAILED DESCRIPTION OF THE PREFERRED EMBODIMENTS

Figure 1:
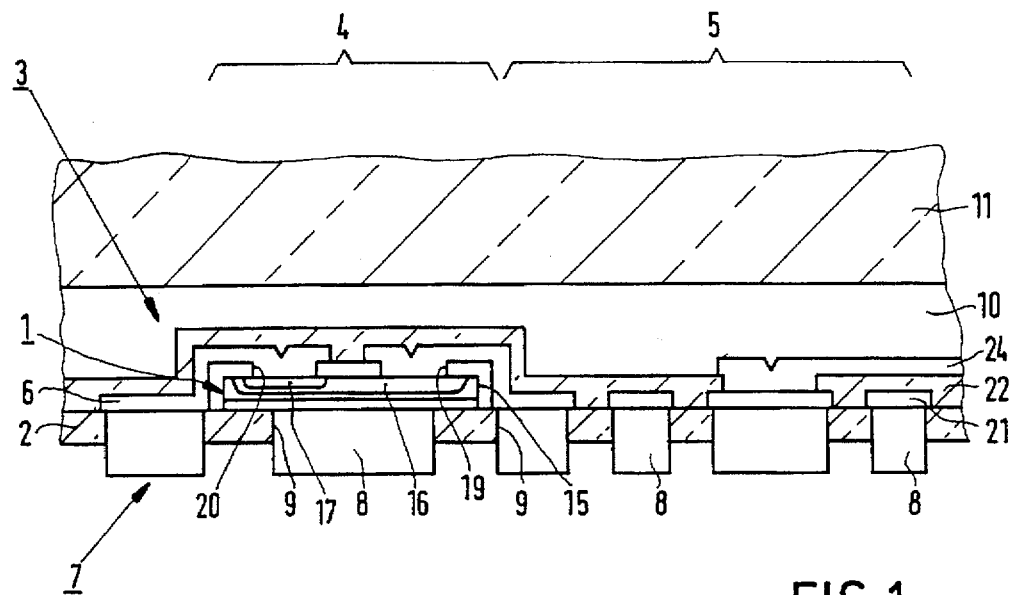
FIG. 1 shows a semiconductor device according to the invention diagrammatically and in cross-section.

FIG. 1 diagrammatically and in cross-section shows a semiconductor device for microwave frequencies with a substrate 1–2 which is provided at a first side 3 with a semiconductor element 4, a passive element 5, and a pattern of conductive elements 6, while the opposed, second side 7 is provided with a metallization 8 which is connected to the elements 4, 5, 6 present at the first side through windows 9 formed in the substrate.

Such a semiconductor device, which is suitable for processing very high-frequency microwave signals, is called a "Microwave Monolithic Integrated Circuit" (MMIC). The semiconductor element 4, i.e. the active element, is a bipolar transistor in the present example, but it may alternatively be a field effect transistor, while the passive element 5 in this example is a coil, but it may also be, for example, a capacitor or a transmission line. In practice, the semiconductor may comprise a few, but also very many such active and passive elements.

According to the invention, the substrate 1–2 is formed by a silicon layer 1 present on a layer 2 of insulating material, the semiconductor element 4 being formed in the silicon layer 1 and the metallization 8 being provided on that side 7 of the layer of insulating material 2 which is remote from the silicon layer 1. The silicon layer 1 may here have a very small thickness of, for example, 0.1 to 0.2 μm. Bipolar as well as field effect transistors capable of processing signals of microwave frequencies can be formed in such a thin silicon layer 1. Since the silicon layer 1 is so thin, the influence of the conductivity of silicon on passive elements is accordingly comparatively small. Silicon always has a comparatively high conductivity in practice. When, for example, a coil is formed on a thick silicon substrate, this coil will have a very low quality factor compared with an identical coil provided on an insulating substrate, for example, made of gallium arsenide. This quality factor will indeed be so low that the use of such a coil in a circuit is impracticable.

The use of the substrate 1–2 renders it possible to realise a semiconductor device with a semiconductor element 4 operating at microwave frequencies and made in silicon and with a passive element 5 operating at these high frequencies and provided on the semiconductor substrate.

To avoid the detrimental influence of silicon on the coil quality still further, the semiconductor element 4 is formed in an insulated island 15 of silicon, while the passive element is provided beside said island of silicon 1, on the insulating layer 2.

The insulating layer 2 of the substrate 1–2 may be comparatively thick, for example, the silicon layer 1 may be provided on a glass plate. A disadvantage of such a solution, however, is that heat generated during operation of the semiconductor device cannot be readily discharged. Preferably, therefore, the substrate 1–2 provided with the semiconductor element 4, the passive element 5, and the conductive element 6 is fastened with its first side 3 to an insulating body 11 by means of a glue layer 10. Said insulating body 11 ensures that the semiconductor device has a sufficient strength. The insulating layer 2 may accordingly have a small thickness, so that heat generated during operation can be removed easily through this thin insulating layer 2.

The insulating body 11 may be, for example, a glass plate, but may also be made of an alternative material. If the passive component is a coil, as in the present example, glass is a good choice for the material of the insulating body 11. Glass has a comparatively low permittivity, so that a capacitance is created between the turns of the coil which is comparatively small, which is favourable for coil operation at high signal frequencies. Ferrites may also be used as the material for the insulating layer 11. These materials have the advantage that the coil 5 formed will have a comparatively high self-inductance. If the passive element is a light waveguide, it may be advantageous for the material of the insulating body 11 to have a high permittivity. If various passive elements are provided on the substrate 1–2, the insulating body 11 may be built up from portions manufactured from different suitable materials which will then be situated opposite the various passive elements.

Figure 2:
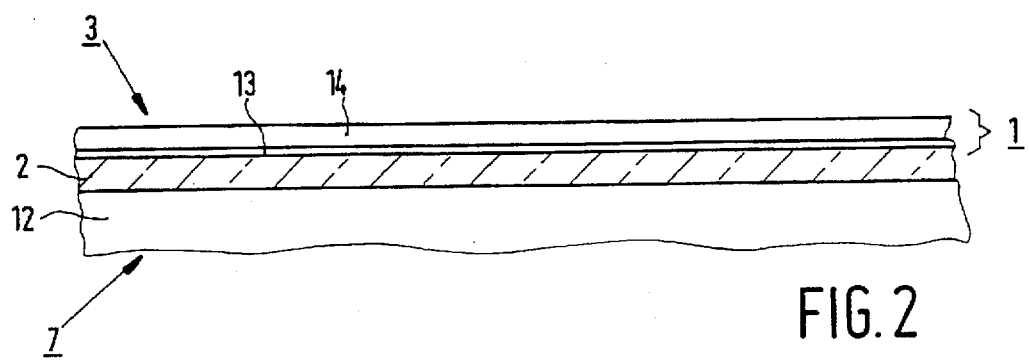
FIGS. 2 to 6 show a few stages in the manufacture of a semiconductor device according to the invention diagrammatically in cross-section and in plan view.

The insulating layer 2 may have a very small thickness here, for example 0.1 to 0.2 μm, when the substrate as shown in FIG. 2 is formed from a silicon slice 12 which is provided at its first side 3 with a buried insulating layer 2 of silicon oxide, the silicon being removed from said slice from the second side 7 down to the buried layer.

In this example, the manufacture of the semiconductor device shown in FIG. 1 starts with a silicon slice 12 shown in cross-section in FIG. 2. This slice is provided at the first side 3 with said insulating layer 2 of silicon oxide with a thickness of approximately 0.4 μm, and an approximately 2 μm thick silicon layer 1 comprising an approximately 0.1 μm thick layer 13 comparatively strongly doped with approximately $10^{20}$ phosphorus atoms per cc and an approximately 0.1 μm thick layer 14 comparatively weakly doped with approximately $10^{16}$ phosphorus atoms per cc. Such a silicon slice 12 may be obtained, for example, by starting with a silicon slice in which the layer 2 of silicon oxide is formed at a depth of approximately 1 μm through implantation of oxygen ions, and by then doping the approximately 1 μm thick layer 13 situated on top of the silicon oxide layer 2 with phosphorus to said concentration, and by finally growing the weakly doped layer 14 epitaxially on the layer 13.

Figure 3:
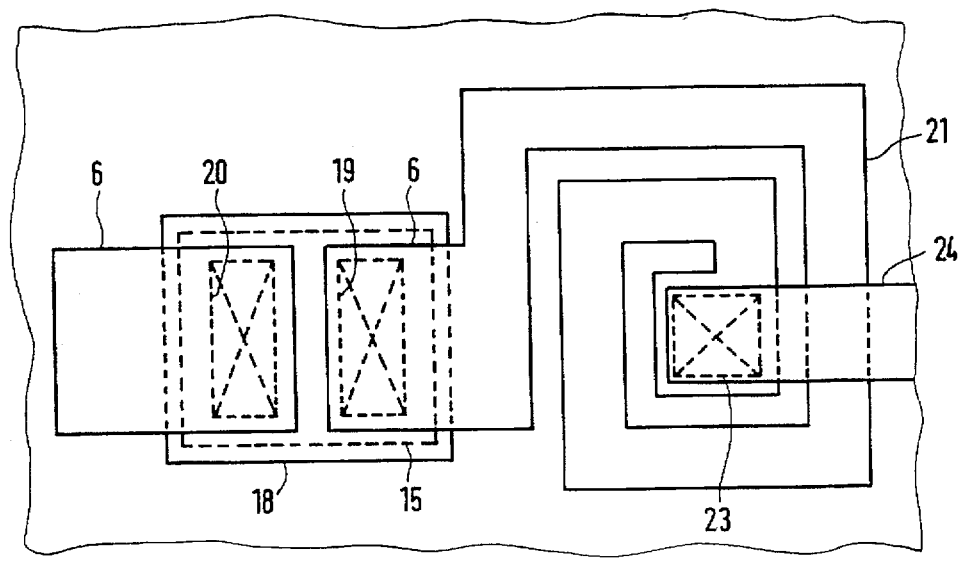
Figure 4:
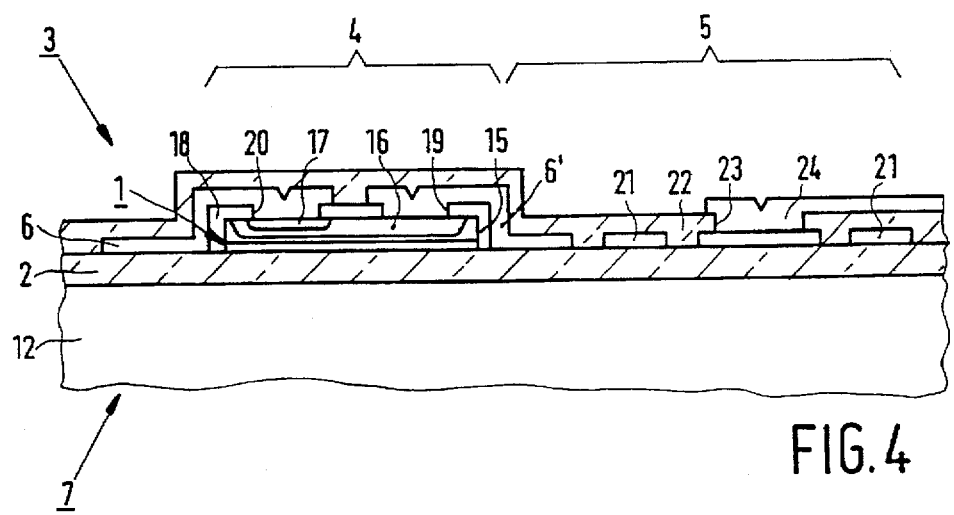
Figure 5:
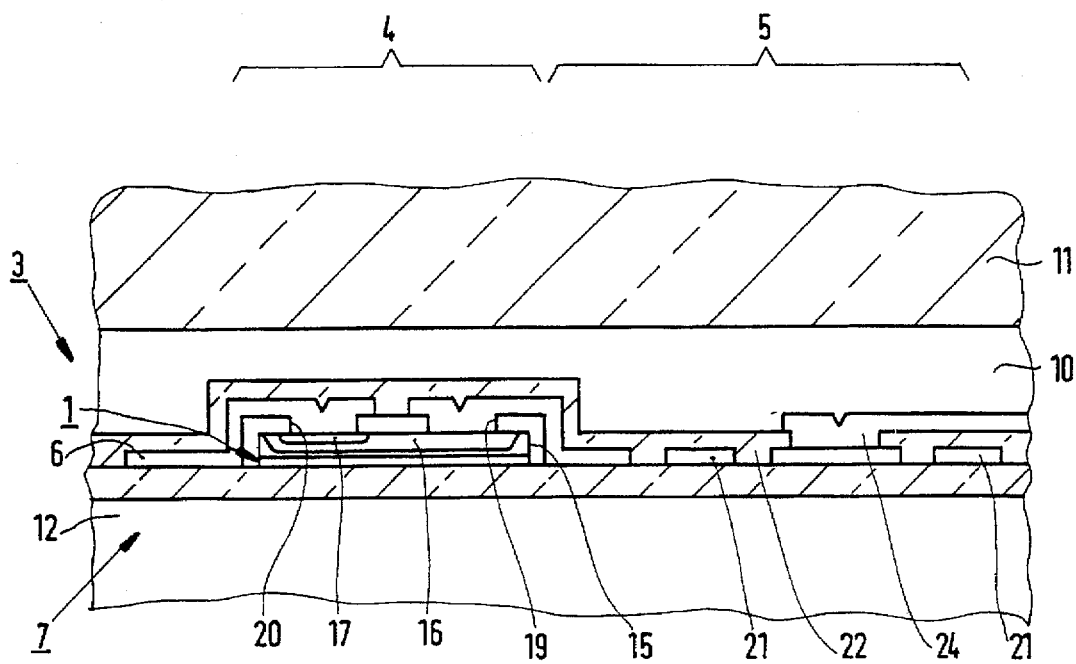
Figure 6:
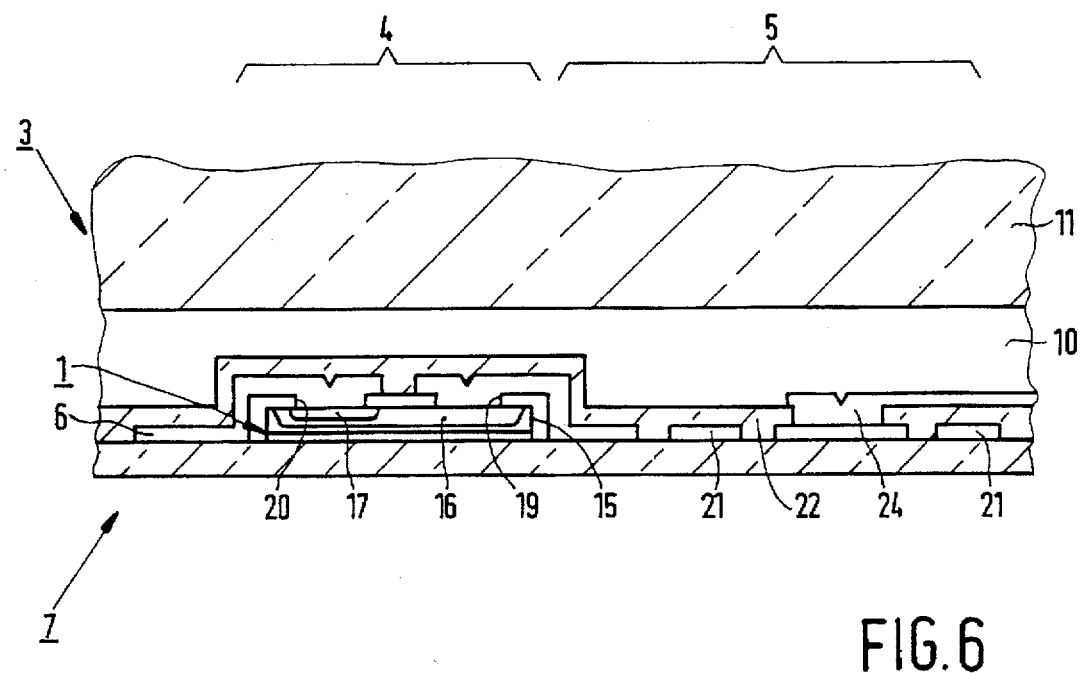

As FIGS. 3 and 4 show in plan view and in cross-section, respectively, an insulated island 15 is formed in the silicon layer. A portion of the silicon layer 1 is for this purpose removed from the insulating layer 2 in the example. An alternative method is, for example, to convert the silicon layer next to the island 15 into insulating silicon oxide. Then a base zone 16 with a doping of approximately $5 \times 10^{17}$ boron atoms and an emitter zone 17 with a doping of approximately $10^{20}$ arsenic atoms are formed in the silicon island in usual manner. The silicon island 15 is subsequently provided with a silicon oxide layer 18 in which windows 19 and 20 are provided for contacting the base zone 16 and emitter zone 17, respectively.

After the transistor 4 has been formed, the pattern of conductive elements 6 with a coil 5 with turns 21 is formed on the insulating layer 2 in an aluminium layer deposited on the substrate 1–2. The entire assembly is covered with a further insulating layer 22 in which a window 23 is formed through which the coil 5 is connected to a conductor 24.

After the transistor 4, the coil 5 and the conductive elements 6 have been formed, the substrate 1–2 is fastened to an insulating body 11 with its first side by means of a glue layer 10. The glue is, for example, an epoxy or an acrylate glue, the insulating body 11 is, for example, a glass plate. Then the silicon slice 12 is removed down to the insulating layer 2. To achieve this, the second side 7 of the slice 12 is subjected to a chemical mechanical polishing treatment until the insulating layer 2 has been approached up to a few μm, after which the layer 2 is exposed to a KOH etching bath. This etching treatment stops automatically the moment insulating silicon oxide layer 2 is reached.

Figure 7:
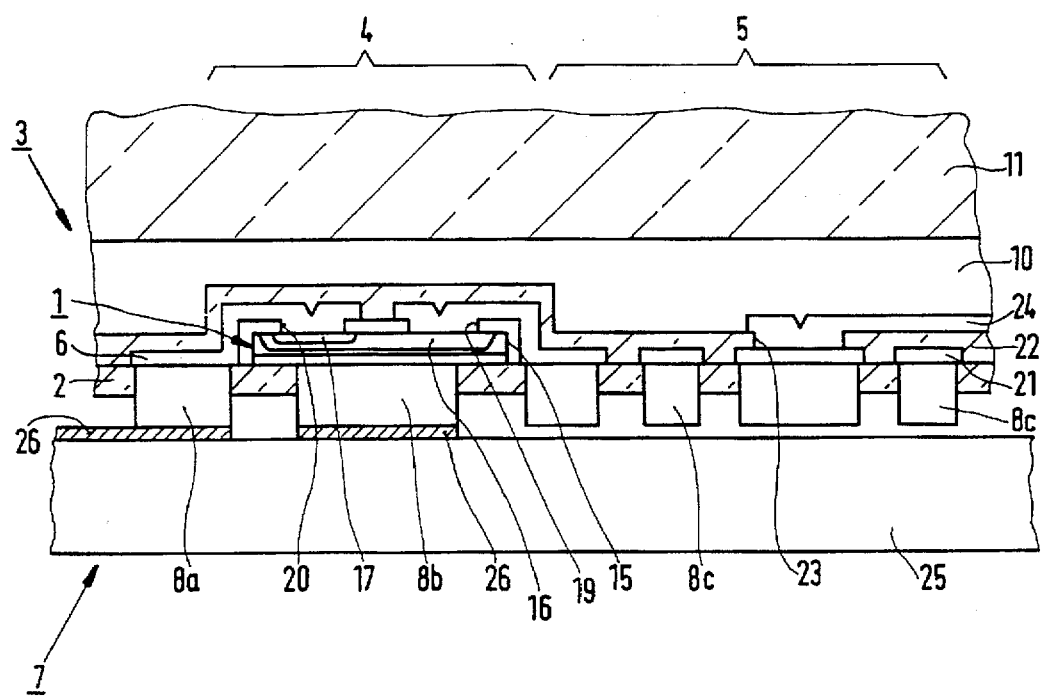
FIG. 7 is a diagrammatic cross-section of the semiconductor device shown in FIG. 1 mounted on an insulating carrier provided with conductor tracks.

Finally, the windows 9 are provided in the insulating layer 2 and the second side 7 of the substrate 1–2 is provided with a metallization 8. Preferably, the metallization 8 is formed in usual manner by electrochemically grown metal parts (bumps). Such metal parts may be used for heat removal and also, as shown in FIG. 7, for mounting the semiconductor device on a carrier 25 of insulating material which is provided with conductor tracks 26. The elements 4, 5, 6 on the first side 3 of the substrate 1–2 are then connected to said conductor tracks 26 via the metal parts 8, so that the elements are externally contacted.

The grown metal parts 8A connected to the conductive elements 6 provided on the first side of the substrate then mainly serve for electrical contacting. The metal parts 8B and 8C which are connected to the silicon layer 1 provided on the first side, in this case to the collector zone of the transistor 4, and to the passive element 5 provided on the first side, respectively, in this example serve for contacting and heat removal (8B) or for heat removal only (8C). The latter conductive elements 8C lie free and are not connected to a conductor track on the carrier 25.

In a preferred embodiment of the semiconductor device according to the invention, the passive element is a coil 5 formed by a metal track 21 which is provided on the layer of insulating material 2 and which has been provided with an electrochemically grown metal pan 8C over practically its entire length through a window made in the layer of insulating material 2. The coil 5 thus consists of comparatively thick turns which are formed by a comparatively thin metal track 21 on which a comparatively thick metal layer 8C has been grown. The coil 5 accordingly has a comparatively low ohmic resistance, so that its quality is high. The metal pans 8C grown on the second side and forming the coil turns are not connected to the conductor tracks 26 present on the carrier 25 of insulating material when the semiconductor body is mounted thereto. Only that portion of the grown parts 8A, and 8B, is connected thereto which serves for external contacting of the semiconductor device.

What is claimed is:

1. A semiconductor device for microwave frequencies, comprising a substrate which is provided, at a first side, with a semiconductor element, a passive element, and a pattern of conductive elements and, at the opposed, second side, with a metallization connected to the elements present at the first side through windows formed in the substrate, the substrate being formed by a layer of silicon which is present on a layer of insulating material, the semiconductor element being formed in the silicon layer and the metallization being formed on a side of the layer of insulating material which is remote from the silicon layer.

2. The semiconductor device of claim 1, wherein the semiconductor element is formed in an insulated silicon island, and the passive element is formed beside said silicon island on the insulating layer.

3. The semiconductor device of claim 2, wherein the substrate is fastened with its first side to an insulating body by means of a layer of glue.

4. The semiconductor device of claim 3, wherein the substrate is formed from a slice of silicon which is provided at its first side with a buried layer of silicon oxide and from which the silicon is removed from the second side down to the buried layer.

5. The semiconductor device of claim 4, wherein the metallization at the second side of the substrate is formed by electrochemically grown metal parts.

6. The semiconductor device of claim 5, wherein at least one of the grown metal parts is connected to the conductive elements provided on the first side of the substrate.

7. The semiconductor device of claim 5, wherein at least one of the electrochemically grown metal parts is connected to conductor tracks provided on an insulating carrier.

8. The semiconductor device of claim 5, wherein at least one of the grown metal parts is connected to the passive elements provided on the first side of the substrate.

9. The semiconductor device of claim 5, wherein at least one of the grown metal parts is connected to the silicon island provided on the first side of the substrate.

10. The semiconductor device of claim 5, wherein the electrochemically grown metal parts comprise bumps.

11. The semiconductor device of claim 6, wherein at least one of the grown metal parts is connected to the silicon island provided on the first side of the substrate.

12. The semiconductor device of claim 6, wherein at least one of the electrochemically grown metal parts is connected to conductor tracks provided on an insulating carrier.

13. The semiconductor device of claim 6, wherein at least one of the grown metal parts is connected to the passive elements provided on the first side of the substrate.

14. The semiconductor device of claim 11, wherein at least one of the grown metal parts is connected to the passive elements provided on the first side of the substrate.

15. The semiconductor device of claim 14, wherein the passive element is a coil formed by a metal track provided on the layer of insulating material, which track is provided with an electrochemically grown metal part over substantially its entire length through a window provided in the layer of insulating material.

16. The semiconductor device of claim 14, wherein at least one of the electrochemically grown metal parts is connected to conductor tracks provided on an insulating carrier.

17. The semiconductor device of claim 9, wherein at least one of the electrochemically grown metal parts is connected to conductor tracks provided on an insulating carrier.

18. The semiconductor device of claim 1, wherein the metallization at the second side of the substrate is formed by electrochemically grown metal parts.

19. The semiconductor device of claim 18, wherein at least one of the electrochemically grown metal parts is connected to conductor tracks provided on an insulating carrier.

20. The semiconductor device of claim 1, wherein the substrate is fastened with its first side to an insulating body by means of a layer of glue.

* * * * *